(12) United States Patent
Chung et al.

(10) Patent No.: US 11,069,762 B2
(45) Date of Patent: Jul. 20, 2021

(54) DISPLAY DEVICE

(71) Applicant: Samsung Display Co., Ltd., Yongin-Si (KR)

(72) Inventors: Ho Ryun Chung, Suwon-si (KR); Myung Hwan Kim, Yongin-si (KR); Jung Sik Nam, Seoul (KR); Se Joong Shin, Cheonan-si (KR); Sang Yeol Kim, Hwaseong-si (KR); Tae Kyoung Hwang, Hwaseong-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/197,004

(22) Filed: Nov. 20, 2018

(65) Prior Publication Data

US 2019/0280075 A1 Sep. 12, 2019

(30) Foreign Application Priority Data

Mar. 9, 2018 (KR) ........................ 10-2018-0028278

(51) Int. Cl.
*H01L 27/32* (2006.01)
*H01L 51/52* (2006.01)
*H05K 1/18* (2006.01)
*H01L 51/00* (2006.01)

(52) U.S. Cl.
CPC ...... *H01L 27/3276* (2013.01); *H01L 51/5203* (2013.01); *H01L 51/5256* (2013.01); *H05K 1/189* (2013.01); *H01L 51/0097* (2013.01); *H05K 2201/10128* (2013.01)

(58) Field of Classification Search
CPC ............. H01L 27/3276; H01L 51/5203; H01L 51/5256; H01L 51/0097; H05K 1/189; H05K 2201/10128
See application file for complete search history.

(56) References Cited

U.S. PATENT DOCUMENTS

| 9,214,640 | B2 | 12/2015 | Lee et al. | |
| 9,419,065 | B2 | 8/2016 | Degner et al. | |
| 2014/0042406 | A1 | 2/2014 | Degner et al. | |
| 2014/0183473 | A1* | 7/2014 | Lee | ...................... H01L 51/0097 257/40 |
| 2016/0282992 | A1* | 9/2016 | Song | ........................ G06F 3/044 |
| 2016/0282993 | A1* | 9/2016 | Song | ........................ G06F 3/044 |
| 2016/0291759 | A1* | 10/2016 | Kurasawa | ........... G02F 1/13338 |
| 2018/0108722 | A1* | 4/2018 | Nishikawa | .......... H01L 27/3276 |
| 2018/0123060 | A1* | 5/2018 | Jang | ..................... H01L 27/3276 |

FOREIGN PATENT DOCUMENTS

| KR | 10-2012-0083854 A | 7/2012 |
| KR | 10-2014-0085956 A | 7/2014 |
| KR | 10-2014-0099139 A | 8/2014 |
| KR | 10-2015-0036443 A | 4/2015 |

\* cited by examiner

*Primary Examiner* — Fernando L Toledo
*Assistant Examiner* — Neil R Prasad
(74) *Attorney, Agent, or Firm* — Innovation Counsel LLP

(57) ABSTRACT

A display device according to an exemplary embodiment includes a display panel including a display area and a bending region. The display panel in the bending region includes a plurality of connection wires, a pattern including a plurality of electrodes, and a protection layer positioned between the plurality of connection wires and the pattern.

18 Claims, 20 Drawing Sheets

DISPLAY DEVICE

CROSS-REFERENCE TO RELATED APPLICATION

This application claims priority to and the benefit of Korean Patent Application No. 10-2018-0028278 filed in the Korean Intellectual Property Office on Mar. 9, 2018, the entire contents of which are incorporated herein by reference.

BACKGROUND

(a) Technical Field

This disclosure relates to a display device.

(b) Description of the Related Art

A display device such as an organic light emitting diode display, a liquid crystal display, etc. is manufactured by forming several layers or elements on a substrate. Glass is used as the substrate of the display device. However, the substrate, when made of the glass, is heavy and easily damaged. In addition, since the glass substrate is rigid, it is difficult to modify the display device. Recently, display devices using a flexible substrate which is light, has impact resistance, and is easily modified have been developed.

The display device using the flexible substrate may be designed so as to bend an edge of the display panel including a pad portion to which a flexible printed circuit film (FPC) to transmit a signal is attached to be toward a screen back side. Accordingly, a dead space may be reduced compared with the display device using the rigid substrate. If the dead space is reduced, the bezel width of the display device may be reduced and utilization of an inner space of the display device increases, thereby designing the display device to be further compact.

The above information disclosed in this Background section is only for enhancement of understanding of the background and therefore it may contain information that does not form the prior art that is already known in this country to a person of ordinary skill in the art.

SUMMARY

Exemplary embodiments provide a display device capable of improving a physical characteristic of the bending region of the display panel, and easily and correctly estimating a processing characteristic of the bending region.

A display device according to an exemplary embodiment includes a display panel including a display area and a bending region. The display panel in the bending region may include a plurality of connection wires, a pattern including a plurality of electrodes, and a protection layer positioned between the plurality of connection wires and the pattern.

The plurality of electrodes may be arranged over at least about 50% of the bending region.

Each electrode may be quadrangular or circular.

The pattern may further include a plurality of bridges connecting the plurality of electrodes.

The display panel may further include a substrate, and the plurality of connection wires may be positioned to cross the bending region on the substrate and be configured to transmit a signal from the display panel.

The protection layer may be positioned on the plurality of connection wires, and the pattern is positioned on the protection layer.

The display panel may further include a pixel electrode positioned in the display area, and the pattern may be made of a same material as the pixel electrode.

The protection layer may be positioned between the substrate and the plurality of connection wires, and the pattern may be positioned between the substrate and the protection layer.

The display panel may further include a gate electrode positioned in the display area, and the pattern may be made of a same material as the gate electrode.

The display panel may further include a first alignment mark and a second alignment mark respectively positioned at both sides in the bending region, and the pattern may be positioned between the first alignment mark and the second alignment mark.

The pattern may further include a plurality of dummy electrodes adjacent to the bending region.

A display device according to an exemplary embodiment includes a display panel including a display area and a bending region, and a protection film positioned on one surface of the display panel to not overlap the bending region. The display panel includes a pattern including a plurality of electrodes arranged in the bending region, the protection film includes a first portion and a second portion respectively positioned at both sides of the bending region, and a portion of the pattern overlaps at least one of the first portion and the second portion.

The pattern may include a plurality of sub-patterns, and each sub-pattern may include a plurality of electrodes positioned symmetrically with respect to one edge of the bending region.

Each sub-pattern may include a plurality of electrodes of which a number is changed farther from the edge of the bending region.

Each sub-pattern may include a plurality of electrodes of which a number increases farther from the edge of the bending region.

Each electrode may be quadrangular or circular.

Each sub-pattern may include a plurality of electrodes having two or more kinds of shapes.

The display panel may further include a substrate and a plurality of connection wires crossing the bending region on the substrate, and the pattern may be positioned at a same layer as the plurality of connection wires.

In the bending region, the display panel may further include a first protection layer positioned between the substrate and the plurality of connection wires and a second protection layer positioned on the plurality of connection wires, and the pattern may be positioned between the first protection layer and the second protection layer.

The display panel may further include a source electrode and a drain electrode positioned in the display area, and the pattern may be made of a same material as the source electrode and the drain electrode.

According to exemplary embodiments, an adhesive remaining in the bending region of the display panel may easily be quantitatively evaluated and the bending stress of the bending region may be relaxed. The cutting accuracy of the protection film removed from the bending region of the display panel may be easily and accurately evaluated, and it is possible to automate the measurement and the evaluation through vision inspection etc.

DETAILED DESCRIPTION OF THE EMBODIMENTS

Figure 1:
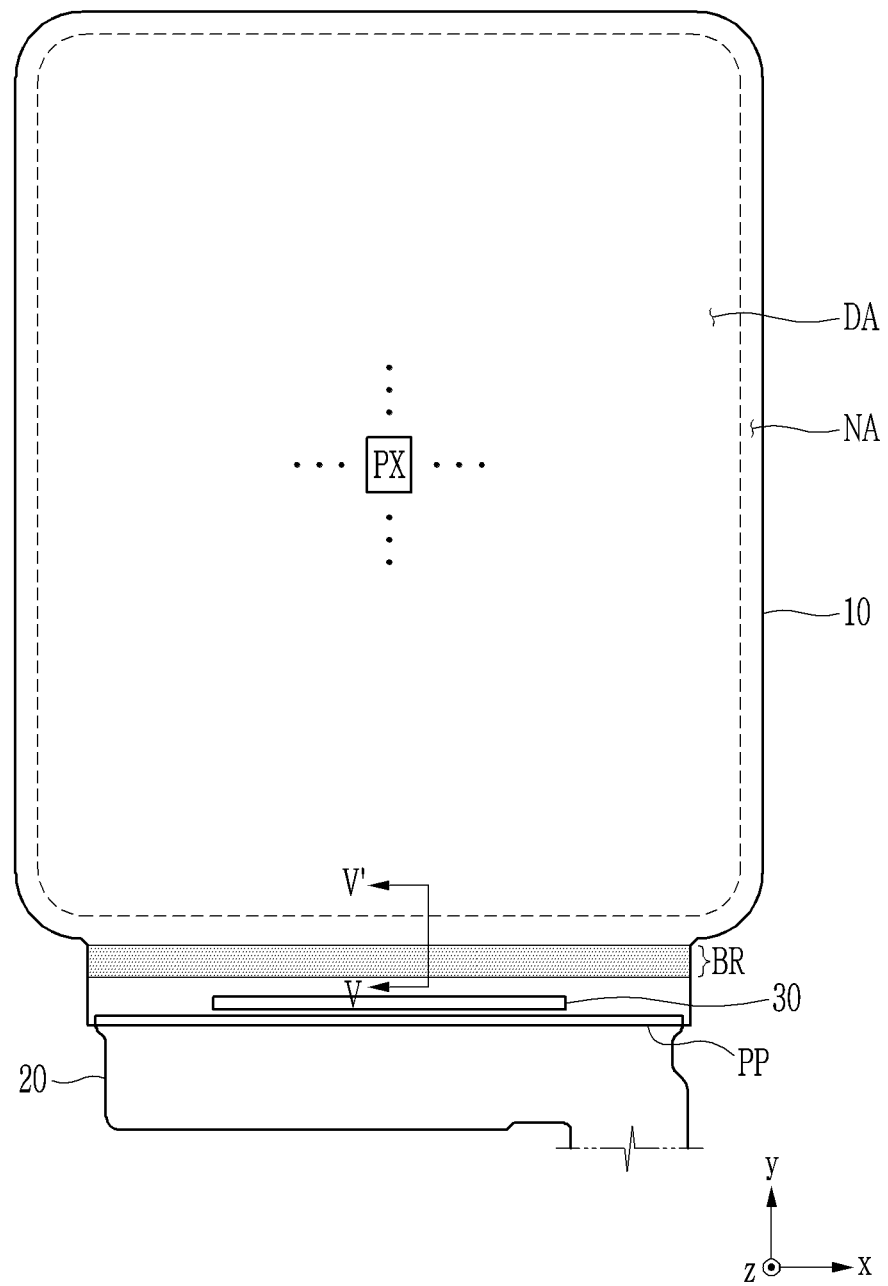
FIG. 1 is a top plan view schematically showing a display device according to an exemplary embodiment.

The inventive concept will be described more fully hereinafter with reference to the accompanying drawings, in which exemplary embodiments are shown. As those skilled in the art would realize, the described embodiments may be modified in various different ways, all without departing from the spirit or scope of the inventive concept.

Like reference numerals designate like elements throughout the specification. In the drawings, the thickness or sizes of respective layers and areas may be enlarged or reduced to clearly illustrate their arrangements and relative positions.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-sectional view" means when a cross-section taken by vertically cutting an object portion is viewed from the side.

Now, a display device according to an exemplary embodiment will be described with reference to accompanying drawings. Even though an organic light emitting diode display is described as a display device, the inventive concept is not limited thereto, and the inventive concept may be applied to other display devices such as a liquid crystal display.

Figure 2:
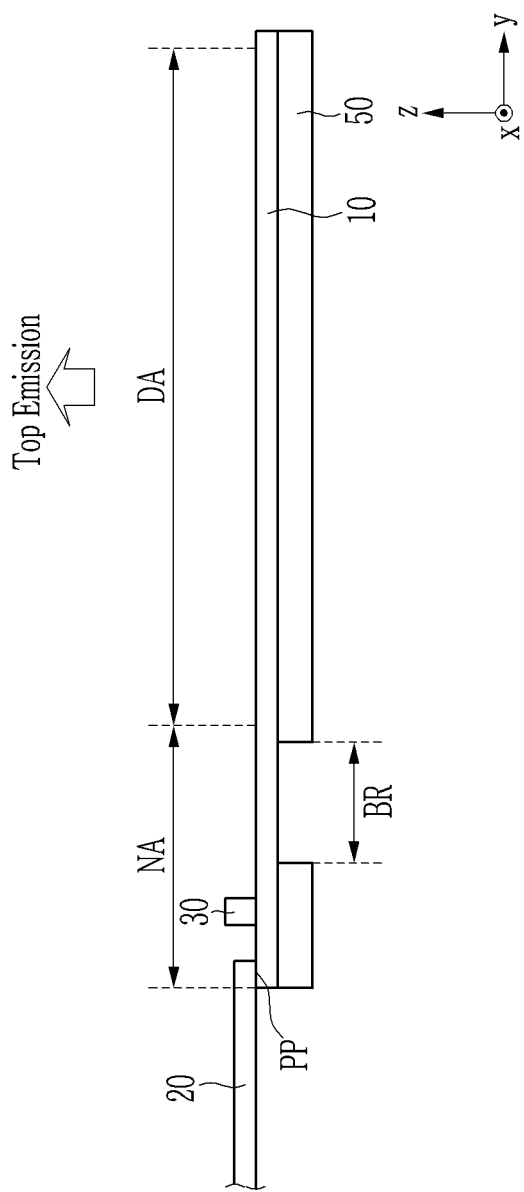
FIG. 2 is a lateral view of the display device shown in FIG. 1 before bending.
Figure 3:
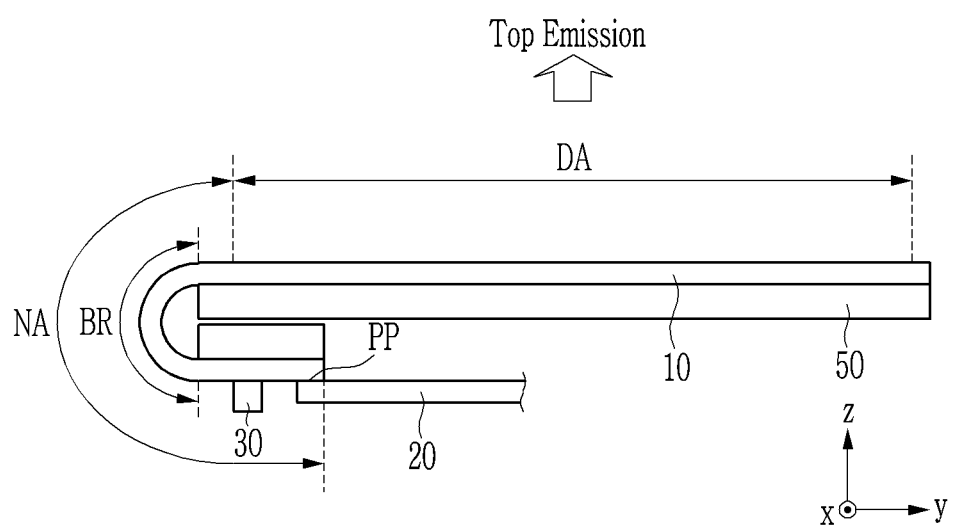
FIG. 3 is a lateral view of the display device shown in FIG. 1 after bending.

FIG. 1 is a top plan view schematically showing a display device according to an exemplary embodiment. FIG. 2 is a lateral view of the display device shown in FIG. 1 before bending. FIG. 3 is a lateral view of the display device shown in FIG. 1 after bending.

Referring to FIG. 1, the display device includes a display panel 10, a flexible printed circuit film 20 attached to the display panel 10, a driving device including an integrated circuit chip 30, etc.

The display panel 10 includes a display area DA corresponding to a screen in which an image is displayed, and a non-display area NA in which circuits and/or signal lines for generating and/or transmitting various signals applied to the display area DA are disposed around the display area DA. In FIG. 1, an inside and an outside of a dotted lined quadrangle respectively correspond to the display area DA and the non-display area NA.

Pixels PX are disposed in a matrix form, for example, in the display area DA of the display panel 10. Signal lines (not shown) such as scan lines (referred to as gate lines), light emission control lines, data lines, and driving voltage lines are also disposed in the display area DA. A scan line, a light emission control line, a data line, and a driving voltage line are connected to each pixel PX, and each pixel PX may receive a scan signal (referred to as a gate signal), a light emission control signal, a data signal, and a driving voltage from these signal lines.

The display area DA may include a touch sensor layer for sensing a contact or non-contact touch of a user. Although the display area DA is illustrated to have a quadrangular shape of which corners are rounded, the display area DA may have various shapes such as a polygonal shape, a circular shape, an elliptical shape, etc.

A pad portion PP in which pads for receiving the signals from the outside of the display panel 10 is positioned in the non-display area NA of the display panel 10. The pad portion PP may be positioned to be elongated in a first direction x along one edge of the display panel 10. The flexible printed circuit film 20 may be bonded to the pad portion PP, and the pads of the flexible printed circuit film 20 may be electrically connected to the pads of the pad portion PP.

A driving device (not shown) generating and/or processing the various signals to drive the display panel 10 may also be positioned in the non-display area NA. The driving device may include a data driver applying the data signal to the data lines, a scan driver applying the scan signal to the scan lines, a light emission driver applying the light emission control signal to the light emission control lines, and a signal controller controlling the data driver, the scan driver, and the light emission driver. The scan driver and the light emission driver may be integrated on the display panel 10. The data driver and the signal controller may be provided as the integrated circuit chip (referred to as a driving IC chip) 30, and the integrated circuit chip 30 may be mounted in the non-display area NA of the display panel 10. The integrated circuit chip 30 may be mounted to a flexible printed circuit board (PCB) that may be electrically connected to the display panel 10.

Referring to FIG. 1, FIG. 2, and FIG. 3, the display panel 10 includes a bending region BR. For example, the bending region BR may be positioned at the non-display area NA between the display area DA and the pad portion PP. The bending region BR may be positioned to cross the display panel 10 in the first direction x. As shown in FIG. 3, the display panel 10 may be bent with a predetermined curvature radius based on a bending axis parallel to the first direction x in the bending region BR. When the display panel 10 is a top emission type, the display panel 10 may be bent so that the pad portion PP and the flexible printed circuit film 20 are farther away from the display area DA than the bending region BR positioned at the back side of the display panel 10. In an electronic device to which the display device is applied, the display panel 10 may be in the bent state as above-described.

The bending region BR may be bent about one bending axis, however the bending region BR may be bent about two or more bending axes. In the drawing, the bending region BR is positioned at the non-display area NA, however the bending region BR may be positioned over the display area DA and the non-display area NA, or in the display area DA.

Referring to FIG. 2 and FIG. 3, a protection film 50 for protecting the display panel 10 is positioned under the display panel 10. The protection film 50 is attached to the rear surface of the display panel 10 by an adhesive. The protection film 50 may be made of a plastic such as polyethylene terephthalate, polyethylene naphthalate, polyimide, polyethylene sulfide, and the like.

The protection film 50 is positioned to cover the entire rear surface of the display panel 10, however it is not positioned in the bending region BR to reduce a bending stress of the bending region BR. The protection film 50 may be formed by removing a protection film portion positioned in the bending region BR after adhering a protection film on the entire rear surface of the display panel 10.

In further detail, the protection film in which the adhesive such as a pressure sensitive adhesive is applied to one surface is uniformly adhered to the entire rear surface of the display panel 10 by a roll lamination method. Next, the adhesive disposed on the bending region BR is photo-decomposed by irradiating ultraviolet rays to the bending region BR such that an adhesive force is deteriorated and the protection film is cut along the first direction x at both sides of the bending region BR (both sides in a second direction y). Next, the protection film portion positioned in the bending region BR, of which both sides are cut, is peeled off. Alignment marks AM shown in FIG. 4 may be used to align a cutting device such as a laser cutter when cutting the protection film.

The adhesive disposed in the bending region BR may be removed along with the removed protection film portion, however a part of the adhesive may remain at the rear surface of the display panel 10 in the bending region BR. Particles are attached to the remaining adhesive (hereinafter referred to as a residual adhesive) such that the display panel 10 may be contaminated and defects may occur. According to an exemplary embodiment, the display panel 10 includes a pattern IP capable of measuring the residual adhesive, and this is described in detail with reference to FIG. 4 and FIG. 5.

Figure 4:
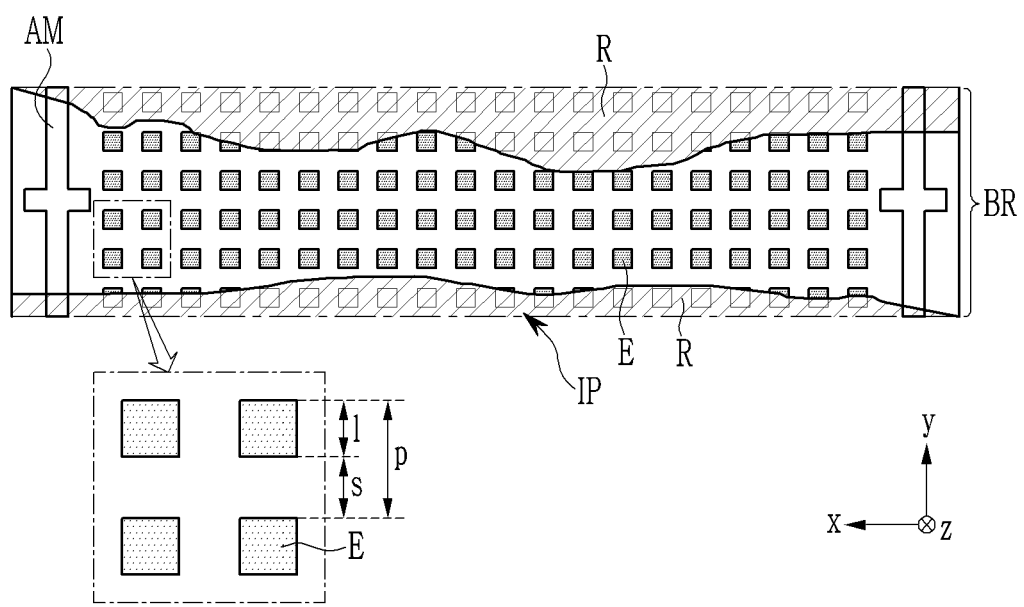
FIG. 4 is an enlarged view of a bending region in FIG. 1.
Figure 5:
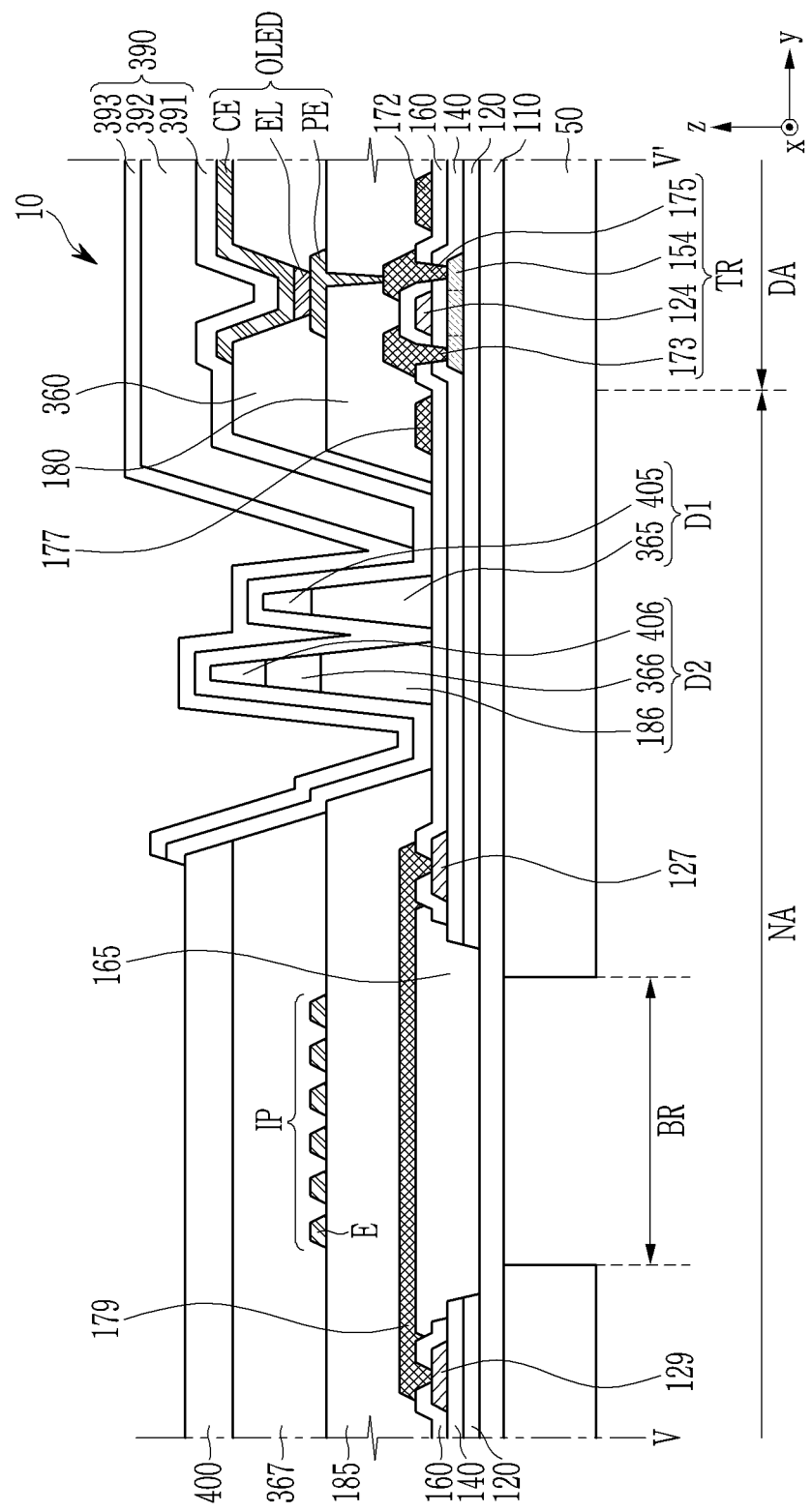
FIG. 5 is a cross-sectional view taken along a line V-V' in FIG. 1.

FIG. 4 is an enlarged view of a bending region in FIG. 1, and FIG. 5 is a cross-sectional view taken along a line V-V' in FIG. 1.

FIG. 4 shows the pattern IP positioned in the bending region BR and the residual adhesive R positioned in the bending region BR. As shown in FIG. 5, a plurality of connection wires 179 crossing the bending region BR in the second direction y are positioned in the bending region BR, and the pattern IP and the alignment marks AM are only shown in FIG. 4 to avoid complication of the drawing.

Referring to FIG. 4, the display panel 10 includes the pattern IP including a plurality of electrodes E in the bending region BR. The electrodes E of the quadrangular shape are shown, however the electrodes E may have various shapes such as polygonal, circular, or oval, as well as the quadrangular. The number of electrodes E may be about 20 to about 2000, about 50 to about 1000, or about 100 to about 500 in the bending region BR. The electrodes E configuring the pattern IP may be positioned over more than about 50%, more than about 70%, or more than about 90% of the bending region, or may be uniformly positioned over substantially the entire bending region BR. The electrodes E may have the same shape and may be arranged with the same interval. The electrodes E may be square of which a length l of one side is about 20 μm to about 100 μm, and a pitch p of the electrodes E may be about 30 μm to about 150 μm. For example, when the pitch p of the electrodes E is set as about 70 μm, the electrodes E having the one length l of about 50 μm may be arranged with an interval s of about 20 μm, and the electrodes E of the one length l of about 35 μm may be arranged with the interval s of about 35 μm. The pattern IP may be formed with about 10% to about 80% area density, about 20% to about 70% area density, or about 30% to about 60% area density in the bending region BR.

If the pattern IP is formed in the bending region BR, by merely observing the number of electrodes E that are or are not overlapped by the residual adhesive R through vision inspection, the degree of the residual adhesive R may be very simply and quantitatively confirmed. For example, in FIG. 4, the pattern IP includes 120 electrodes E. If the electrode E in which an area of more than 50% is overlapped by the residual adhesive R is set as an overlapping electrode E, there are about 50 such overlapping electrodes E. That is, it may be confirmed that the area density of the residual adhesive R is about 42% (=50/120×100%) of the bending region BR. Since brightness may be different when inspecting the electrodes E overlapped and not overlapped by the residual adhesive R with an optical microscope, a complicated device or algorithm to confirm the overlapping is not required.

If the residual adhesive R does not overlap by more than a predetermined level, subsequent processes for the manufacturing of the display device may be executed or the display device may be shipped, and if it is above the predetermined level, the display device may be regarded as defective. Since the pattern IP is uniformly arranged on the entire bending region BR, the pattern IP has a function of relieving the bending stress of the bending region BR and controlling a neutral plane along with the function of estimating the residual adhesive R. A detailed description thereof is given later, and how the pattern IP is formed in the display panel 10 is first described with reference to FIG. 5.

The alignment marks AM may be positioned at both sides in the first direction x in the bending region BR. Accordingly, the pattern IP may be positioned between the alignment marks AM in the bending region BR. The alignment marks AM may have a cruciform planar shape as shown, or may have other shapes.

Referring to FIG. 5, the cross-sectional of the display area DA and the bending region BR of the display panel 10 is schematically shown. The display panel 10 includes a substrate 110, and several layers, wires, and elements formed thereon. In the display area DA of the display panel 10, a very large number of pixels are disposed, but only one pixel is simply shown and described to avoid drawing complexity. Also, each pixel includes the transistors, the capacitor, and the organic light emitting diode, however the stacked structure of the display panel 10 is described based on one transistor TR and one organic light emitting diode OLED connected thereto.

The substrate 110 may be the flexible substrate. The substrate 110 may made of polymers such as polyimide, polyamide, polycarbonate, and polyethylene terephthalate. The substrate 110 may include a barrier layer for preventing penetration of moisture etc. from the outside. The barrier layer may include an inorganic insulating material such as a silicon oxide ($SiO_x$), a silicon nitride ($SiN_x$), etc.

A buffer layer 120 is positioned on the substrate 110. The buffer layer 120 serves a function of preventing the impurity that may be diffused from the substrate 110 to a semiconductor layer 154 in the process forming the semiconductor layer 154 and reducing stress applied to the substrate 110. The buffer layer 120 may include an inorganic insulating material such as a silicon oxide, a silicon nitride, etc. The buffer layer 120 may be positioned over the entire surface of the substrate 110, however it may not be positioned in the bending region BR. This is because the layer formed on the inorganic insulating material is vulnerable to the bending such that cracks may occur or the wires located in the bending region BR may be damaged.

The semiconductor layer 154 of the transistor TR is positioned on the buffer layer 120. The semiconductor layer 154 includes a channel region overlapping a gate electrode 124, and a source region and a drain region disposed at respective sides thereof. The semiconductor layer 154 may include a polysilicon, amorphous silicon, or an oxide semiconductor.

A first insulating layer 140 including the inorganic insulating material such as a silicon oxide or a silicon nitride is positioned on the semiconductor layer 154. The first insulating layer 140 may be referred to as a gate insulating layer. The first insulating layer 140 may not be positioned in the bending region BR.

A gate conductor including a scan line, the gate electrode 124 of the transistor TR, a first wire 127, and a second wire 129 is positioned on the first insulating layer 140. The gate conductor may be formed of the same material in the same process. The gate conductor may include a metal such as molybdenum (Mo), copper (Cu), aluminum (Al), silver (Ag), chromium (Cr), tantalum (Ta), titanium (Ti), or a metal alloy thereof. The first wire 127 may be connected to the display area DA (e.g., the signal line such as the data line or the driving voltage line) and the driving device (e.g., the scan driver or the light emission driver), and the second wire 129 may be connected to an output pad of the integrated circuit chip 30 or a pad of the pad portion PP.

A second insulating layer 160 is positioned on the first insulating layer 140 and the gate conductor. The second insulating layer 160 may include an inorganic insulating material such as a silicon oxide, a silicon nitride, a silicon oxynitride (SiON), and a silicon oxyfluoride (SiOF). The second insulating layer 160 may be referred to as an interlayer insulating layer. The second insulating layer 160 may not be positioned in the bending region BR.

A data conductor including a data line, a driving voltage line 172, a source electrode 173, and a drain electrode 175 of the transistor TR, a voltage transmitting line 177, and a connection wire 179 is positioned on the second insulating layer 160. The data conductor may be formed of the same material in the same process. The source electrode 173 and the drain electrode 175 may be respectively connected to the source region and the drain region of the semiconductor layer 154 through contact holes formed in the second insulating layer 160 and the first insulating layer 140. The voltage transmitting line 177 may transmit a power voltage such as a driving voltage, a common voltage, etc. Referring to FIG. 4, the alignment marks AM may be formed of the same material and in the same process as the source electrode 173 and the drain electrode 175. The alignment marks AM may be formed of the same material and in the same process as the gate electrode 124.

The connection wire 179 is mainly positioned in the bending region BR. The connection wire 179 may cross the bending region BR to be extended in the direction approximately parallel to the second direction y. One end and the other end of the connection wire 179 are respectively connected to the first wire 127 and the second wire 129 through contact holes formed in the second insulating layer 160. Accordingly, the first wire 127 and the second wire 129 as the gate conductor are electrically connected to each other by the connection wire 179. Therefore, the signal (e.g., the data signal, the control signal, or the voltage signal) output from the integrated circuit chip 30, the signal (e.g., the driving voltage (ELVDD) or the common voltage (ELVSS)) input to the pad of the pad portion PP, etc. may be transmitted to the display area DA, the driving device, etc. through the second wire 129, the connection wire 179, and the first wire 127. Since the connection wire 179 is bent when the bending region BR is bent, it may be formed of a metal having excellent flexibility and a low Young's modulus. If the flexibility of the connection wire 179 increases, since the stress for the strain decreases, risks of a degradation (e.g., a crack occurrence) or a disconnection at the bending region BR may be reduced.

The data conductor may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), and the like, and a metal alloy thereof. The data conductor may be a multilayer, and may have a triple-layer structure including, e.g., a bottom layer (ancillary layer) for improving contact properties and an upper layer (capping layer) for preventing oxidation or the like. The lower layer and the upper layer may include titanium (Ti), chromium (Cr), molybdenum (Mo), or tantalum (Ta), for example. For example, the data conductor may be a multilayer such as titanium/aluminum/titanium (Ti/Al/Ti), titanium/copper/titanium (Ti/Cu/Ti), or molybdenum/aluminum/titanium (Mo/Al/Mo), but the embodiments are not limited thereto.

A first protection layer 165 is positioned between the substrate 110 and the connection wire 179 in the bending region BR. Part of the first protection layer 165 may overlap the first insulating layer 140 or the second insulating layer 160. In the bending region BR, the first protection layer 165 may be positioned directly on the substrate 110, and the lower surface of the first protection layer 165 may be in contact with the upper surface of the substrate 110. The first protection layer 165 may include the organic insulating material. The organic insulating material may include polyimide, an acryl-based polymer, a siloxane-based polymer, and the like.

The gate electrode 124, the source electrode 173, and the drain electrode 175 form the transistor TR along with the semiconductor layer 154. In the shown transistor TR, the gate electrode 124 is positioned on the semiconductor layer 154, however the structure of the transistor is not limited thereto and may be variously changed.

A third insulating layer 180 is positioned on the second insulating layer 160 and the data conductor. The third insulating layer 180 is positioned as and forms a second protection layer 185 in the bending region BR and in the vicinity thereof. In the bending region BR, the second protection layer 185 may be positioned on the first protection layer 165. The third insulating layer 180 and the second protection layer 185 may be formed of the same material in the same process. The third insulating layer 180 and the second protection layer 185 may include the organic insulating material, for example the polyimide, acryl-based polymer, siloxane-based polymer, and the like. The connection wire 179 is sandwiched between the first protection layer 165 and the second protection layer 185. That is, in the bending region BR, the connection wire 179 is enclosed by the first protection layer 165 and the second protection layer 185 including the organic insulating material, thereby being prevented from being damaged in the bending.

A pixel electrode PE is positioned on the third insulating layer 180 in the display area DA. The pixel electrode PE may be connected to the drain electrode 175 through a contact hole formed in the third insulating layer 180. The pattern IP is positioned on the second protection layer 185 in the bending region BR. The pattern IP may be formed of the same material in the same process as the pixel electrode PE. For example, a conductive material is deposited on the third insulating layer 180 and the second protection layer 185 by a sputtering method and the like to form a conductive layer, and then the conductive layer is patterned by a photolithography process to form the pixel electrode PE and the pattern IP together. If the pattern IP is formed by this method, it is not necessary to add a process to form the pattern IP, and the pattern IP does not interfere with other conductors of the bending region BR, that is, the connection wire 179.

The pattern IP may be formed along with other constituent elements as well as the pixel electrode PE of the display area DA, or may be separately formed from the constituent elements formed in the display area DA. The alignment marks AM may be formed of the same material in the same process as the pixel electrode PE.

The pixel electrode PE and the pattern IP may include the metal such as silver (Ag), nickel (Ni), gold (Au), platinum (Pt), aluminum (Al), copper (Cu), molybdenum/aluminum neodymium (Mo/AlNd), or a metal alloy thereof. The pixel electrode PE and the pattern IP may include a transparent conductive material such as indium tin oxide (ITO) and indium zinc oxide (IZO). For example, the pixel electrode PE and the pattern IP may be the multilayer such as ITO/silver (Ag)/ITO.

A fourth insulating layer 360 having an opening overlapping the pixel electrode PE is positioned on the third insulating layer 180. The opening of the fourth insulating layer 360 may define each pixel area and be referred to as a pixel definition layer. The fourth insulating layer 360 may be positioned at a third protection layer 367 on the second protection layer 185 in the bending region BR. The fourth insulating layer 360 and the third protection layer 367 may be formed of the same material in the same process. The fourth insulating layer 360 and the third protection layer 367 may include the organic insulating material.

An emission layer EL is positioned on the pixel electrode PE. A common electrode CE transmitting a common voltage is positioned on the emission layer EL. The common electrode CE is formed by thinly laminating metals having low work functions such as calcium (Ca), barium (Ba), magnesium (Mg), aluminum (Al), silver (Ag), and the like to have a light transmitting property. The common electrode CE may be formed of the transparent conductive material such as ITO and IZO. The pixel electrode PE, the emission layer EL, and the common electrode CE of each pixel constitute a light-emitting element as the organic light emitting diode OLED.

An encapsulation layer 390 is positioned on the common electrode CE. The encapsulation layer 390 may prevent moisture or oxygen from penetrating from the outside by encapsulating the organic light emitting diode OLED. The encapsulation layer 390 may be a thin film encapsulation layer in which an inorganic material layer and/or an organic material layer are deposited. In the shown exemplary embodiment, the encapsulation layer 390 is the thin film encapsulation layer including a first inorganic material layer 391, a second inorganic material layer 393, and an organic material layer 392 therebetween. The encapsulation layer 390 may not be positioned in the bending region BR.

A polarization layer to reduce reflection of external light may be positioned on the encapsulation layer 390. The polarization layer may not overlap the bending region BR.

A bending protection layer 400 for relieving tensile stress and protecting the connection wire 179 is positioned on the third protection layer 367 in the bending region BR. The bending protection layer 400 may be referred to as a stress neutralization layer. The bending protection layer 400 may include the organic insulating material such as an acryl resin.

At least one dam D1 and D2 may be positioned between the encapsulation layer 390 and the bending region BR. The dams D1 and D2 may include a first dam D1 and a second dam D2. The first dam D1 may be positioned to be closer to the display area DA than the second dam D2, and the second dam D2 may be formed to be higher than the first dam D1. Each of the first dam D1 and the second dam D2 may include at least one layer. For example, the first dam D1 may include a first layer 365 and a second layer 405 positioned thereon. The first layer 365 may be formed of the same material in the same process as the fourth insulating layer 360, and the second layer 405 may be formed of the same material in the same process as the bending protection layer 400. The second dam D2 may include a first layer 186, a second layer 366, and a third layer 406. The first layer 186 may be formed of the same material in the same process as the third insulating layer 180, the second layer 366 may be formed of the same material in the same process as the fourth insulating layer 360, and the third layer 406 may be formed of the same material in the same process as the bending protection layer 400. The first and second dams D1 and D2 may have a function of preventing the organic material from overflowing toward the non-display area NA when forming the organic material layer 392 of the encapsulation layer 390. The first inorganic material layer 391 and the second inorganic material layer 392 configuring the encapsulation layer 390 may be formed to be extended on the first and second dams D1 and D2. In this case, as the contact area of the first inorganic material layer 391 and the second inorganic material layer 392 increases, an adhesion force between the first inorganic material layer 391 and the second inorganic material layer 392 may increase.

The protection film 50 is positioned under the substrate 110. The protection film 50 may be attached to the substrate 110 by the adhesive such as a pressure sensitive adhesive or an optically clear adhesive. As above-described, the protection film 50 is removed to reduce the bending stress in the bending region BR, and the adhesive that existed between the substrate 110 and the protection film 50 before removing the protection film 50 may remain at the lower surface of the substrate 110. The pattern IP formed in the bending region BR may be used to estimate the remaining amount of the adhesive.

Figure 6:
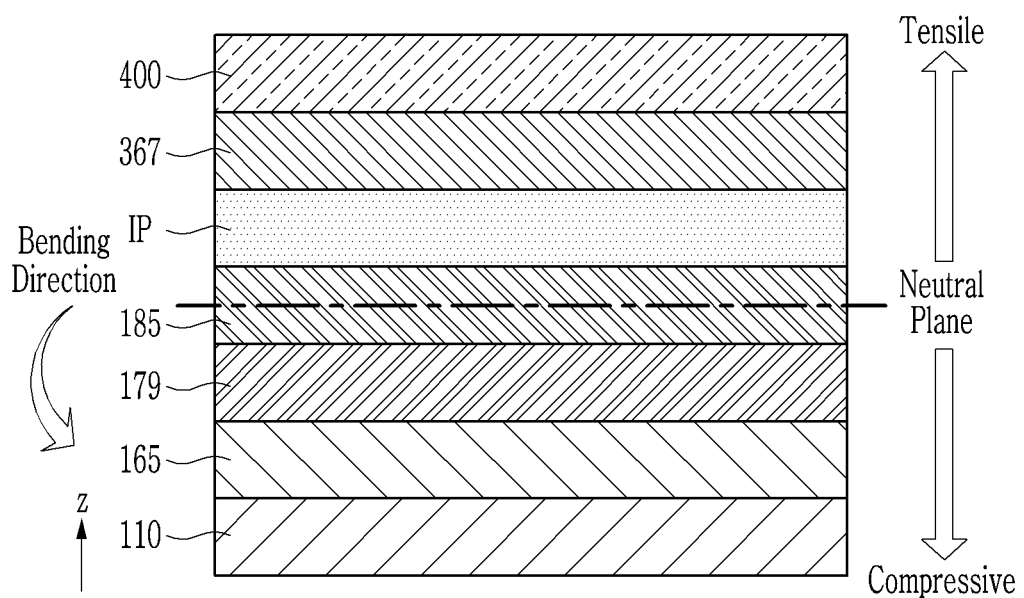
FIG. 6 is a view schematically showing a cross-sectional structure of a bending region in FIG. 1.

FIG. 6 is a view schematically showing a cross-sectional structure of the bending region BR in FIG. 1.

The bending region BR of the display panel 10 may have the structure in which the substrate 110, the first protection layer 165, the connection wire 179, the second protection layer 185, the pattern IP, the third protection layer 367, and the bending protection layer 400 are sequentially deposited.

It is important to design the bending region BR so that the connection wire 179 is not damaged during the bending. For this, the connection wire 179 is positioned between the first protection layer 165 and the second protection layer 185 including the organic insulating material. Also, the layers of the bending region BR may be formed so that a neutral plane of the bending region BR is positioned to be close to the connection wire 179. The neutral plane is the surface within the bending region BR, where the material of the bending region BR is not under stress, either compression or tension, when the bending region BR is loaded by a bending force. During the bending of the bending region BR, tensile stress is generated at the portion on (above) the neutral plane and compressive stress is generated at the portion under the neutral plane. Since the connection wire 179 may be weaker to the tensile stress rather than the compressive stress, the neutral plane may be positioned slightly above the connection wire 179, for example as shown, on the second protection layer 185. Thus, to position the neutral plane, it is necessary to form the bending protection layer 400 to be thick as well as the second protection layer 185 and the third protection layer 367 formed along with the third insulating layer 180 and the fourth insulating layer 360 formed in the display area DA.

The pattern IP may move the neutral plane upward since the pattern IP is positioned above the connection wire 179. That is, the pattern IP controls the position of the neutral plane to be suitable for relieving the bending stress generated in the connection wire 179. Also, by forming the pattern IP, even if the bending protection layer 400 to control the neutral plane is formed to be thinner, the neutral plane of the bending region BR may be controlled in a predetermined position. In FIG. 6, the pattern IP is positioned between the second protection layer 185 and the third protection layer 367, however it may be positioned between the other layers as well as between the third protection layer 367 and the bending protection layer 400.

Figure 7:
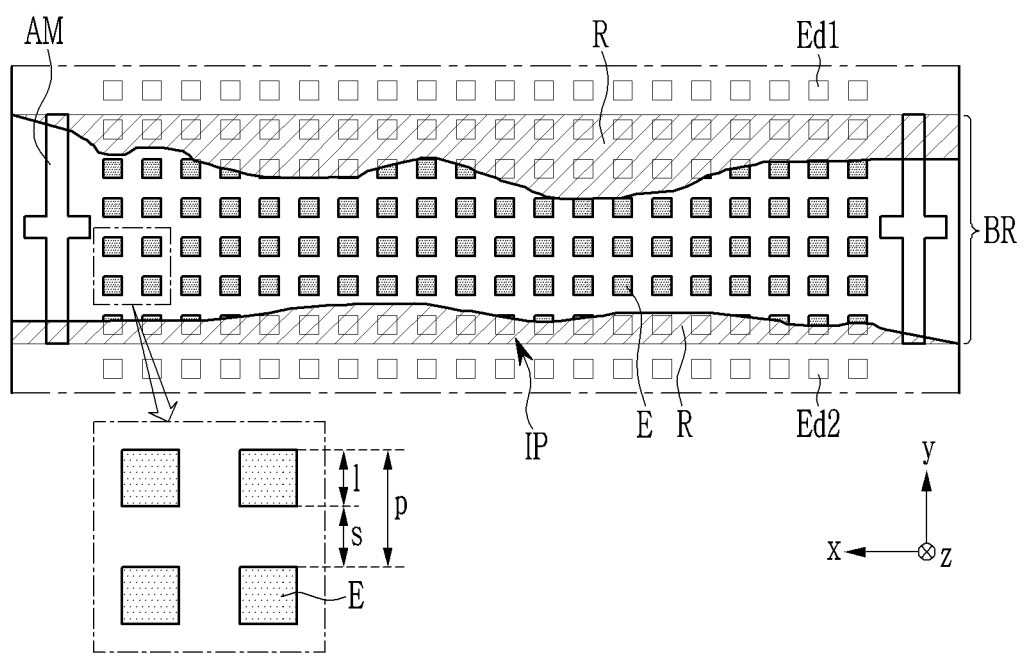
FIG. 7 is an enlarged view of a bending region and a region adjacent thereto in FIG. 1.

FIG. 7 is an enlarged view of a bending region and a region adjacent thereto in FIG. 1.

Referring to FIG. 7, the pattern IP as shown in FIG. 4 may be formed to the region adjacent to the bending region BR in the second direction y as well as the bending region BR. That is, in the plan view, the pattern IP may include first dummy electrodes Ed1 positioned above the bending region BR and second dummy electrodes Ed2 positioned below the bending region BR along the electrodes E positioned in the bending region BR. As above-described, if the pattern IP further including the dummy electrodes Ed1 and Ed2 is formed, the neutral plane region of the bending region BR that may be controlled by the pattern IP may be expanded to the region adjacent to the bending region BR, and a margin of the bending region BR may be obtained. That is, even if the display panel 10 is not correctly bent in the intended bending region BR and the region adjacent to the bending region BR is bent, since the neutral plane region is expanded by the pattern IP, the wires (particularly the connection wires 179) positioned in this region may be protected.

The pattern IP include the first dummy electrodes Ed1 of the first column and the second dummy electrodes Ed2 of the first column, however the first dummy electrodes Ed1 of two columns or more and/or the second dummy electrodes Ed2 of two columns or more may or may not be included. The pitch of the first dummy electrodes Ed1 and the pitch of the second dummy electrodes Dd2 may be the same as the pitch p of the electrodes E. The shape and the size of the first and second dummy electrodes Ed1 and Ed2 may be the same as the shape and the size of the electrodes E, and may have various shapes such as the quadrangle, a polygon other than the quadrangle, the circle, and the oval.

Some exemplary embodiments of the pattern IP and a bending stress relieving effect related thereto are described with reference to FIG. 8 to FIG. 12.

Figure 8:
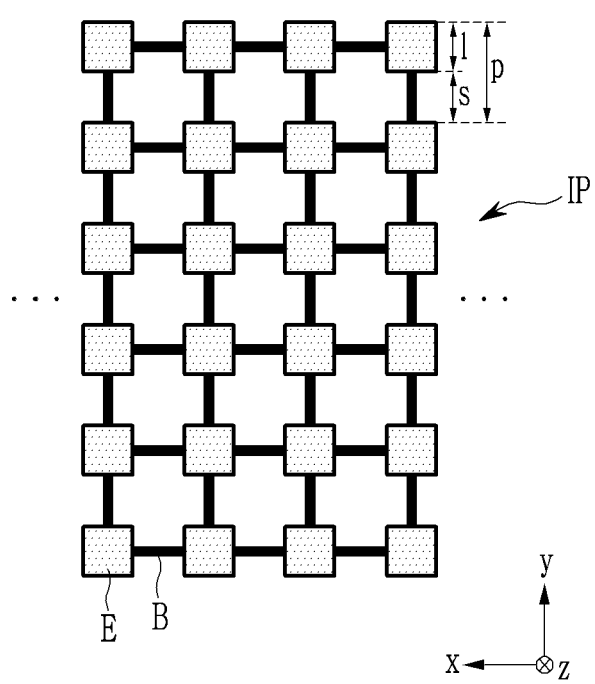
FIG. 8 and FIG. 9 are views showing a pattern positioned at a bending region of a display device according to an exemplary embodiment.
Figure 9:
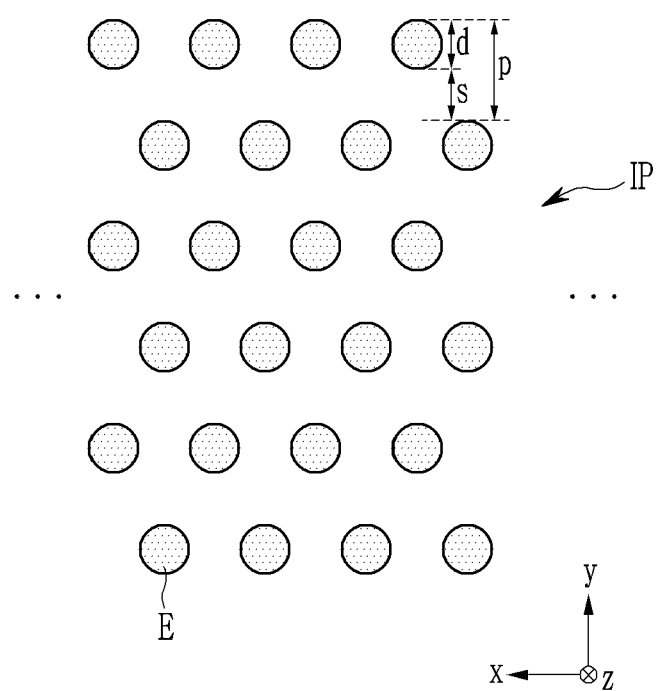

FIG. 8 and FIG. 9 are views showing a pattern IP positioned at a bending region of a display device according to an exemplary embodiment.

Referring to FIG. 8, the pattern IP includes a plurality of electrodes E and bridges B connecting the adjacent electrodes E. The width of the bridge B is smaller than the width of the electrode E, and for example, may be about 5 μm to about 20 μm. The electrodes E may be quadrangular with the same size, and may be arranged in the same interval s and pitch p. As above-described, if the pattern IP of which the electrodes E are connected by the bridges B, as shown in FIG. 4, the area density of the pattern IP may be increased in the bending region BR compared with the pattern IP only including the electrodes E. For example, the pattern IP may have area density of about 20% to about 90% or about 40% to about 80%. If the area density of the pattern IP increases, the bending stress control capacity may be increased. On the other hand, when the pattern IP includes the first and second dummy electrodes Ed1 and Ed2 shown in FIG. 7, the first and second dummy electrodes Ed1 and Ed2 may be connected to the bridges B by the same method as shown in FIG. 8.

Referring to FIG. 9, an example in which each electrode E configuring the pattern IP is circular is shown. The electrode E may be circular having a diameter d of about 20 μm to about 100 μm, and the pitch p of the electrodes E may be about 30 μm to about 150 μm.

For example, when the pitch p of the electrodes E is set to about 70 μm, the electrodes E of the diameter d of about 50 μm may be arranged with the interval s of about 20 μm, and the electrodes E of the diameter d of about 35 μm may be arranged with the interval s of about 35 μm. The electrodes E are parallel to the first direction x and are oblique to the second direction y, however they may also be parallel to the second direction y.

The electrode E may have various shapes as well as that shown in FIG. 8 and FIG. 9, and the pattern IP may be formed by the electrodes E that are regularly arranged over substantially the entire bending region BR. The electrodes E of the various shapes may have a structure that is connected by the bridges B.

Figure 10:
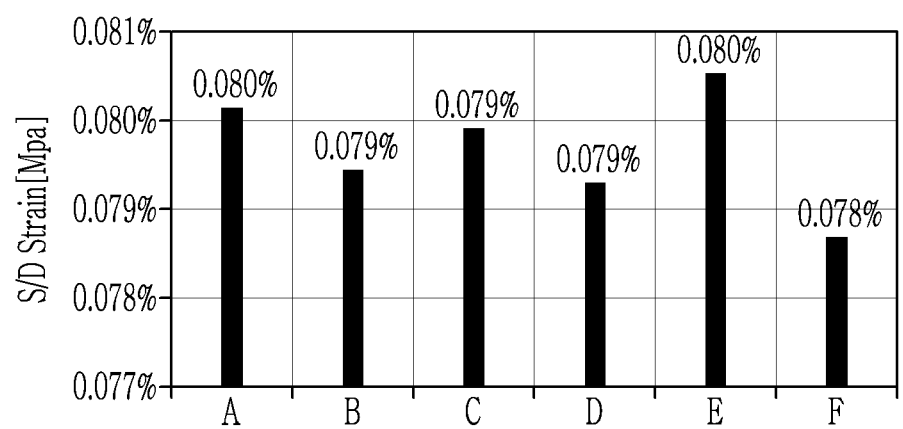
FIG. 10 and FIG. 11 are graphs showing influence of a connection wire according to a shape of a pattern when bending a bending region.
Figure 11:
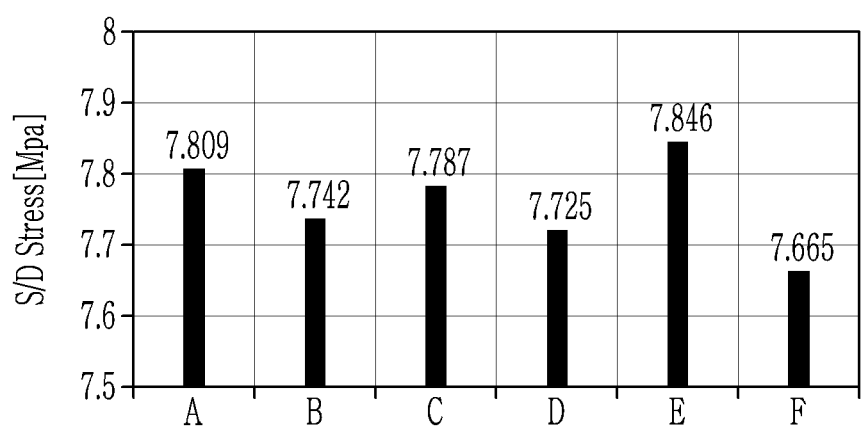
Figure 12:
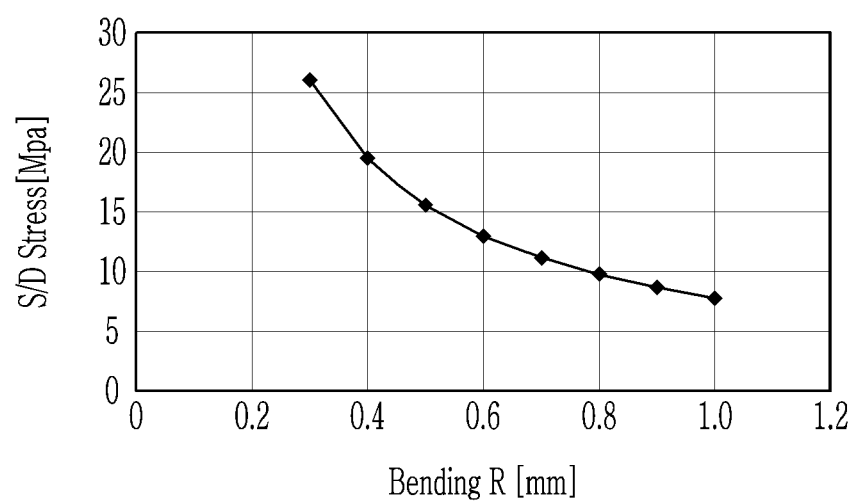
FIG. 12 is a graph showing influence of a connection wire according to a curvature radius when bending a bending region.

FIG. 10 and FIG. 11 are graphs showing influence for a connection wire 179 according to a shape of a pattern when bending a bending region. FIG. 12 is a graph showing influence for a connection wire 179 according to a curvature radius when bending a bending region.

In the graphs of FIG. 10 and FIG. 11, each of exemplary embodiments A to E is a case where the pattern IP is formed in the bending region BR, and exemplary embodiment F is a case where the pattern IP is not formed in the bending region BR. Each bending region BR is bent with a 1 mm curvature radius.

TABLE 1

| | A | B | C | D | E |
|---|---|---|---|---|---|
| Shape of electrode E | square | square | circle | circle | square |
| One side length l/diameter d | 50 μm | 35 μm | 50 μm | 35 μm | 50 μm |

TABLE 1-continued

|  | A | B | C | D | E |
|---|---|---|---|---|---|
| Pitch p | 70 μm | 70 μm | 70 μm | 70 μm | 70 μm |
| Bridge B | N | N | N | N | Y |

Referring to FIG. 10 and FIG. 11, as the area of the electrodes E increases with the same pitch p, the strain and the stress largely appear and the strain and the stress are largest in the case including the bridges B (exemplary embodiment E). This means that the effect of relieving the bending stress is larger as the area density of the pattern IP increases. When forming the pattern IP, the strain and the stress appear larger than when not forming the pattern IP. Accordingly, the pattern IP may relieve the strain and the stress during the bending of the bending region BP.

Referring to FIG. 12, at the bending of the bending region BR, it appears that the curvature radius and the stress of the connection wire 179 are about inversely proportional. The pattern IP may be more effective for relieving the bending stress increase with a smaller curvature radius.

Thus far, the bending of the bending region BR, the forming of the pattern IP, etc. have been described in the case that the display panel 10 is a front emission type in the exemplary embodiments. However, in the case that the display panel 10 is a bottom emission type, the bending direction of the bending region BR, the formation position of the pattern IP, etc. may be different from the above-described exemplary embodiments. The case that the display panel 10 is the bottom emission type is described with reference to FIG. 13 and FIG. 14 while mainly focusing on differences from the above-described exemplary embodiments.

Figure 13:
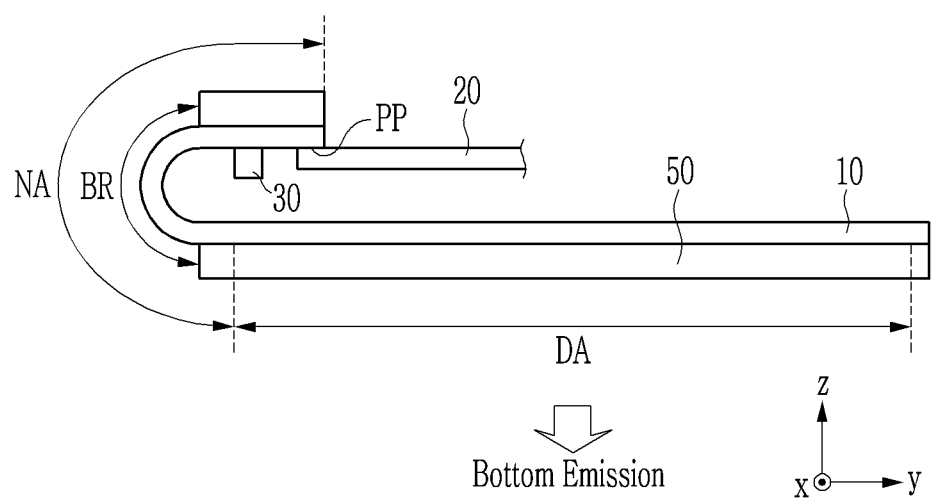
FIG. 13 is a lateral view of the display device according to an exemplary embodiment after bending.
Figure 14:
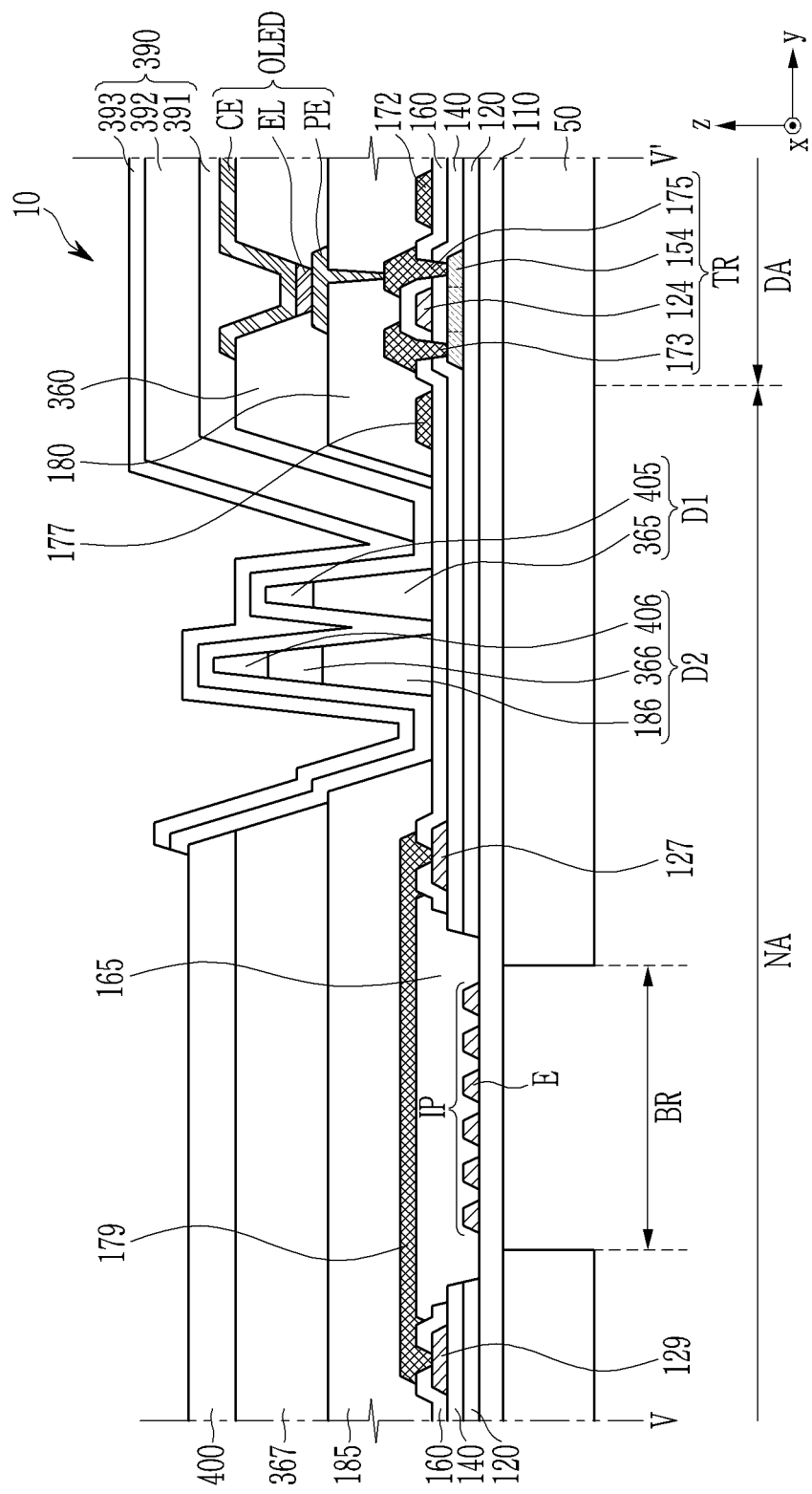
FIG. 14 is a cross-sectional view of a display device according to an exemplary embodiment.

FIG. 13 is a lateral view of the display device according to an exemplary embodiment after bending, and FIG. 14 is a cross-sectional view of a display device according to an exemplary embodiment.

Referring to FIG. 13, when the display panel 10 is the bottom emission type, the bending region BR may be bent in the direction opposite to that shown in FIG. 3. Accordingly, the pad portion PP and the flexible printed circuit film 20 may be bent to be positioned in front of the display panel 10. In this bending, in the bending region BR, the compressive stress is generated at the upper portion of the neutral plane and the tensile stress is generated at the lower portion of the neutral plane.

Referring to FIG. 14, the cross-section of the region corresponding to the line V-V' in FIG. 1 is shown. Since the connection wire 179 is weaker to compressive stress than to tensile stress, it may be suitable for the neutral plane to be positioned slightly lower than the connection wire 179. Therefore, as it is possible to form the pattern IP below the connection wire 179, not above, to move the neutral plane downward, the bending stress of the connection wire 179 may be relieved.

To form the pattern IP without addition of a process, the inspection pattern IP may be formed of the same material in the same process as the configuration formed in the display area DA before the formation of the connection wire 179, for example, the gate electrode 124. The pattern IP may be formed along with other constituent elements except for the gate electrode 124 of the display area DA, or may be separately formed from the constituent elements formed in the display area DA. In the case that the display panel 10 is the bottom emission type, since light emitted from the emission layer EL of the organic light emitting diodes OLED must be emitted to the rear surface of the display panel 10, the pixel electrode PE may be formed of only the transparent conductive material having a high work function, or the transparent conductive material layer and the transflective metal layer.

Next, a description is given in connection to processing accuracy inspection when cutting the protection film for removing the protection film in the bending region BR of the display panel 10. Description of the constituent elements described above is omitted or simplified.

Figure 15:
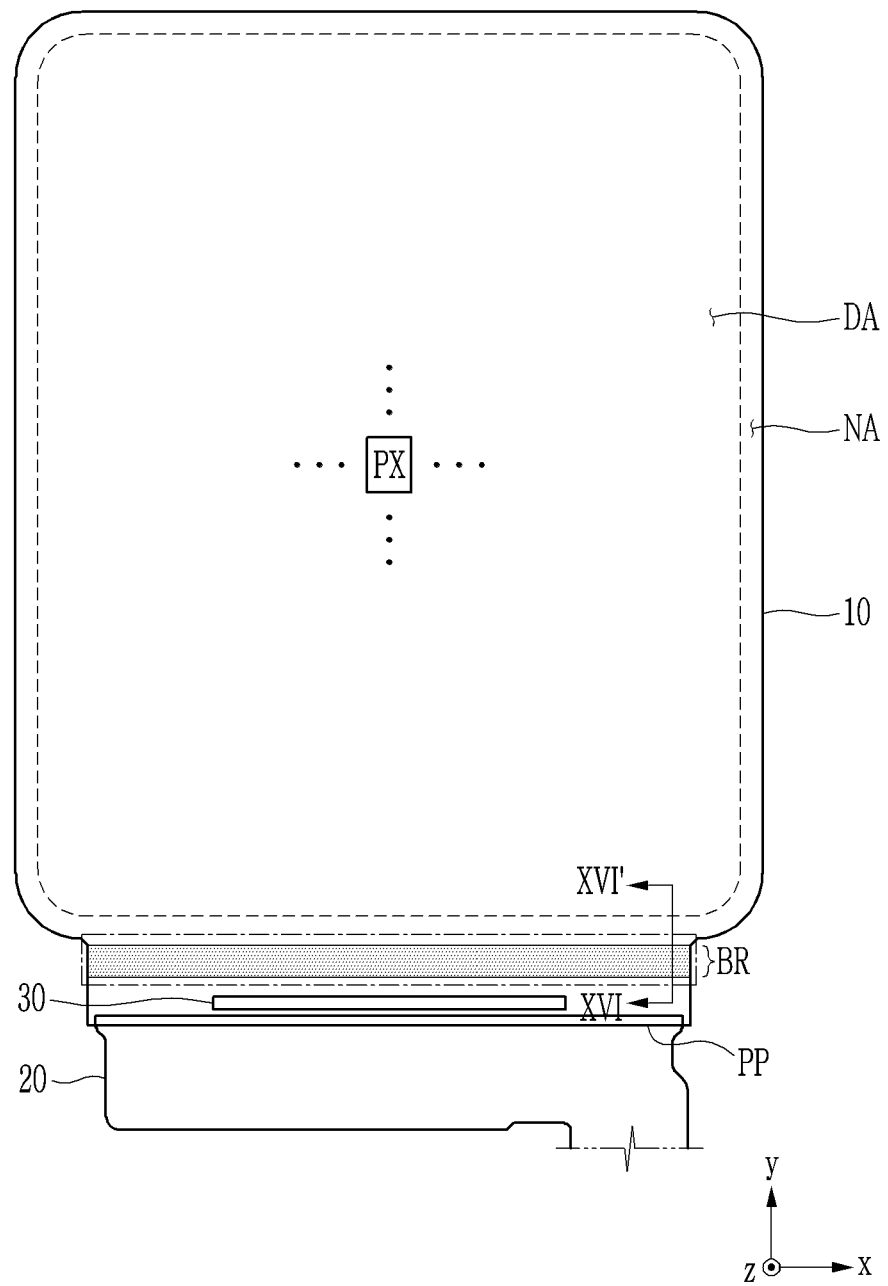
FIG. 15 is a top plan view schematically showing a display device according to an exemplary embodiment.
Figure 16:
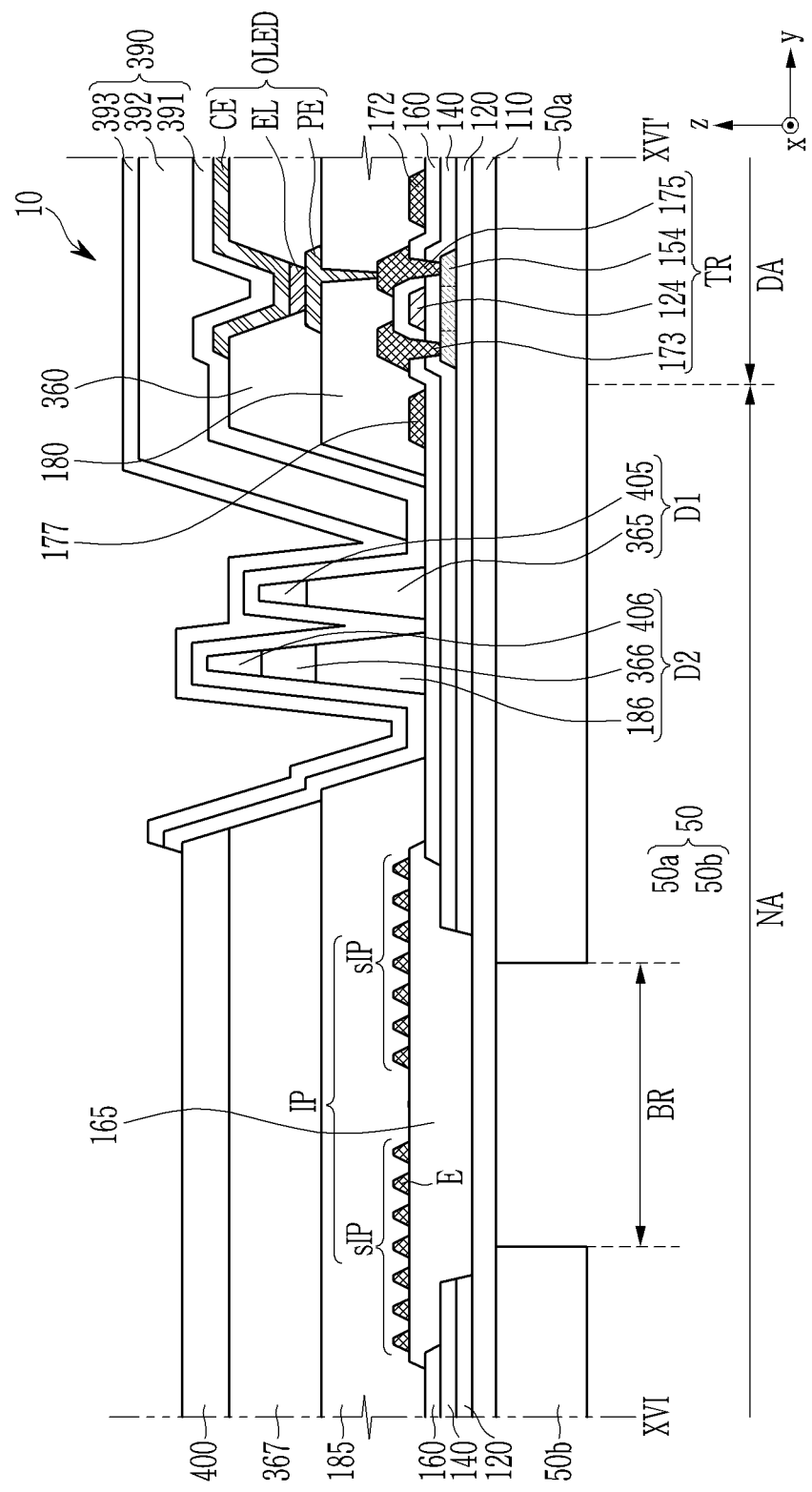
FIG. 16 is a cross-sectional view taken along a line XVI-XVI' of FIG. 15.

FIG. 15 is a top plan view schematically showing a display device according to an exemplary embodiment. FIG. 16 is a cross-sectional view taken along a line XVI-XVI' of FIG. 15. FIG. 17, FIG. 18, FIG. 19, and FIG. 20 are enlarged views of a region indicated by a single-dot chain line in FIG. 15 according to an exemplary embodiment.

FIG. 15 shows the display device as shown in FIG. 1. FIG. 16 shows the cross-section of the edge portion of both sides (both sides in the first direction x) of the bending region BR of the display panel 10 in FIG. 15. The protection film 50 is attached to the portion except for the bending region BR at the rear surface of the display panel 10. The protection film 50 includes a first portion 50a and a second portion 50b respectively positioned at both sides of the bending region BR.

The pattern IP including a sub-pattern sIP is positioned in the bending region BR and at the vicinity thereof. That is, the pattern IP is not limited to within the bending region BR, but extends beyond the boundary of the bending region BR, and then is disposed to the outside the bending region BR. This pattern IP is used to evaluate cutting accuracy of the protection film in the bending region BR, differently from the pattern IP to evaluate the residual adhesive R described with reference to FIG. 1 to FIG. 14. The display panel 10 may include both of the pattern IP to evaluate the residual adhesive R and the pattern IP to evaluate the protection film cutting accuracy, or may include only one of them.

As shown in FIG. 16, the pattern IP may be positioned between the first protection layer 165 and the second protection layer 185. The pattern IP may be formed of the same material in the same process as the source electrode 173 and the drain electrode 175 of the transistor TR. In the bending region BR of the display panel 10, the connection wire 179 transmitting the data signal, the control signal, the driving voltage, etc. is positioned as shown in FIG. 5, however the connection wire 179 may be positioned in the edge portion (e.g., the region within about 0.1 mm to 0.3 mm from the edge) of the right/left sides of the bending region BR. Accordingly, although the pattern IP is formed of the same data conductor as the source electrode 173, the drain electrode 175, the connection wire 179, it does not interfere with the connection wires as the other conductors of the bending region BR.

The pattern IP may be positioned between other layers. For example, the pattern IP may be positioned between the second protection layer 185 and the third protection layer 367, between the third protection layer 367 and the bending protection layer 400, between the buffer layer 120 and the first insulating layer 140, between the first insulating layer 140 and the second insulating layer 160, or between the substrate 110 and the first protection layer 165. The pattern IP may be formed of the same material in the same process as the semiconductor layer 154, as the gate electrode 124, as the pixel electrode PE, or as the common electrode CE. As above-described, if the pattern IP is formed along with the constituent elements formed in the display area DA, it is not necessary to add the process to form the pattern IP.

For forming the protection film 50 to not be positioned only in the bending region BR, the protection film 50 is entirely attached to the rear surface of the display panel 10, the protection film 50 is laser-cut along the first direction x at both sides of the bending region BR (both sides in the second direction y), and the protection film portion positioned in the bending region BR is detached. The pattern IP is used to evaluate how accurately the laser cutting is performed.

Figure 17:
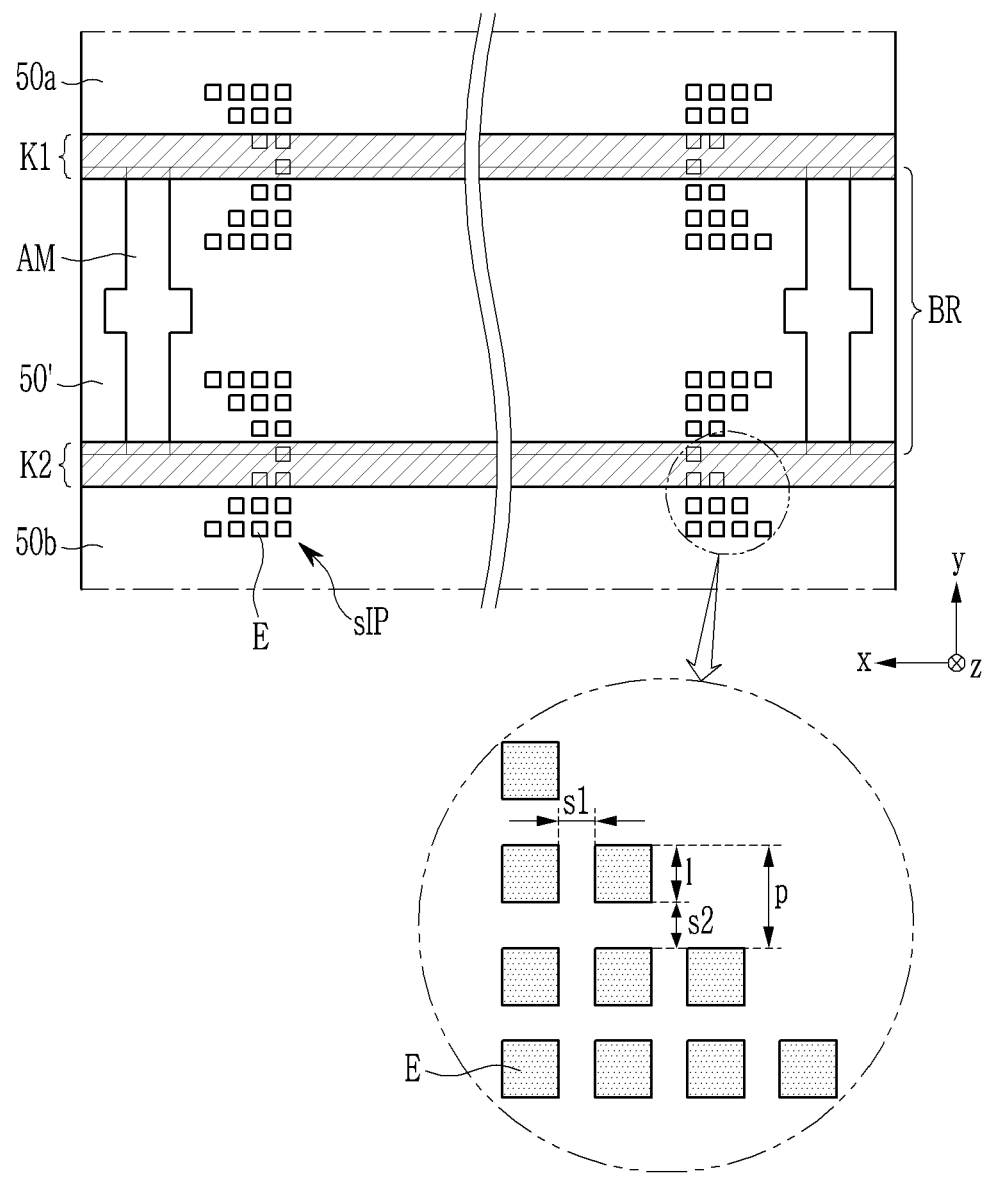
FIG. 17, FIG. 18, FIG. 19, and FIG. 20 are enlarged views of a region indicated by a single-dot chain line in FIG. 15 according to an exemplary embodiment.
Figure 18:
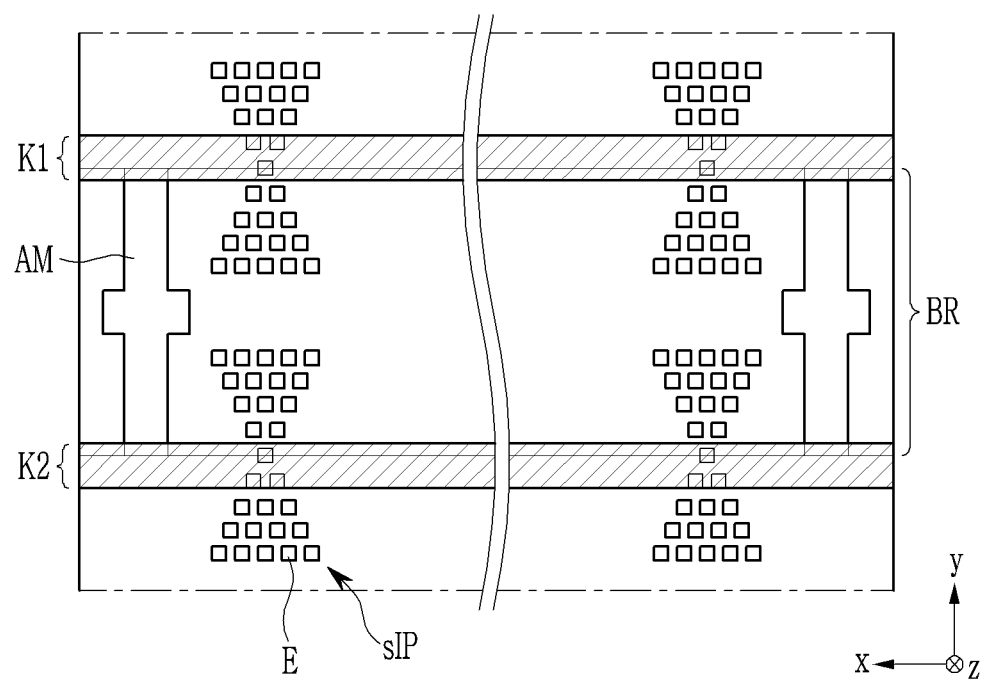

FIG. 17 shows the state that the protection film is cut by the laser at the upper edge and the lower edge of the bending region BR. The protection film portion 50' is positioned in the bending region BR after the cutting of the protection film but before its removal. The pattern IP includes the electrodes E positioned at the edge portion of both sides of the bending region BR at the right and left sides of the bending region BR. The pattern IP includes the sub-patterns sIP of the upper and lower edge portions of the bending region BR near the edges of both sides of the bending region BR. The electrodes E configuring each sub-pattern sIP are positioned over the outside and the inside of the bending region BR at the upper edge portion and the lower edge portion of the bending region BR. Accordingly, one portion of the sub-pattern sIP overlaps the first portion 50a or the second portion 50b of the protection film 50.

The example that the pattern IP includes four sub-patterns sIP and the sub-patterns sIP are positioned at the inside of the bending region BR rather than the alignment marks AM, however the pattern IP may include sub-patterns sIP of fewer or more than four and the sub-patterns sIP may be positioned at the outside of the bending region BR rather than the alignment marks AM.

The laser cutting may be performed by aligning a laser cutting device such as a $CO_2$ laser cutter with reference to the alignment marks AM and irradiating a laser beam along the upper and lower edges of the bending region BR. If the laser beam is irradiated to the protection film, the protection film is fused by heat energy. If the protection film is cut by the laser beam, cuffs K1 and K2 having a predetermined width are generated by a volume loss. The protection film may be divided into the protection films 50a and 50b that are not positioned in the bending region BR and the protection film portion 50' positioned in the bending region BR by the cuffs K1 and K2.

The cuffs K1 and K2 are spaces where the protection film is removed by the laser cutting. The cuffs K1 and K2 limit the cut side surfaces of the protection film. The cuffs K1 and K2 may have the cross-sectional shape of an appropriate "U" character to "V" character, and a maximum width may be about 100 µm to about 200 µm. Even if the irradiation position of the laser beam is aligned with reference to the alignment marks AM, an alignment error may be generated due to an equipment tolerance or a material tolerance, so the edge portion of the protection film 50 towards the bending region BR may invade the bending region BR or leave the bending region BR by the alignment error. Accordingly, if the laser cutting exceeds a permissible error level, excessive stress is generated at the bending region BR, particularly the upper and/or lower edge portion of the bending region BR in the bending after the removal of the protection film portion 50' positioned in the bending region BR, or the portion except for where the bending region BR may be bent. Thus, a crack is generated in the wires positioned in the bending region BR or the vicinity thereof, or the wires may be disconnected. To evaluate whether the laser cutting is correctly performed is for preventing generation of defects, and is required in the process.

As shown in the exemplary embodiment, as the pattern IP is formed at the upper and lower edge portions of the bending region BR, the accuracy of the laser cutting may be easily and correctly evaluated. In further detail, the sub-pattern sIP of the pattern IP may include the electrodes E of which the number increases up and down farther away from the upper edge of the bending region BR, and the sub-pattern sIP may include the electrodes E of which the number increases up and down farther from the lower edge of the bending region BR. The electrodes E are formed symmetrically with respect to the upper edge of the bending region BR and are formed symmetrically with respect to the lower edge of the bending region BR. As above-described, if the pattern IP is formed, by just evaluating the number of electrodes E that do not overlap the cuffs K1 and K2 by the vision inspection, etc., the alignment level of the laser cutting and the processing accuracy may be measured.

For example, at the upper edge of the bending region BR in FIG. 17, seven electrodes E are above the cuff K1, and nine electrodes E are under the cuff K1. Since the electrodes E are formed symmetrically with respect to the upper edge of the bending region BR and the number of electrodes E under the cuff K1 is larger than the number of the electrodes E above it, it may be quickly confirmed that the cuff K1 is positioned slightly above the upper edge of the bending region BR. The electrodes E overlapping the cuffs K1 and K2 and the electrodes E that do not overlap the cuffs K1 and K2 are different in brightness at the time of the examination with an optical microscope, for example the overlapped electrodes E may be displayed darker, so it may be easily checked. The sub-pattern sIP may have a structure in which the number of electrodes E decreases farther from the upper and lower edges of the bending region BR.

The size and the interval of the electrodes E may be appropriately determined by considering the width of the cuffs K1 and K2, and alignment margin accuracy. For example, the electrodes E may be square of which the length 1 of one side is about 5 µm and may be formed with the interval s1 of about 3 µm in the first direction x, the interval s2 of about 5 µm in the second direction y, and the pitch p of 10 µm. The electrodes E may be square of which the length 1 of one side is about 10 µm and may be formed with the interval s1 of about 6 µm in the first direction x, the interval s2 of about 10 µm in the second direction y, and the pitch p of 20 µm. As the pitch p of the electrodes E decreases, the alignment error may be further precisely measured.

Figure 19:
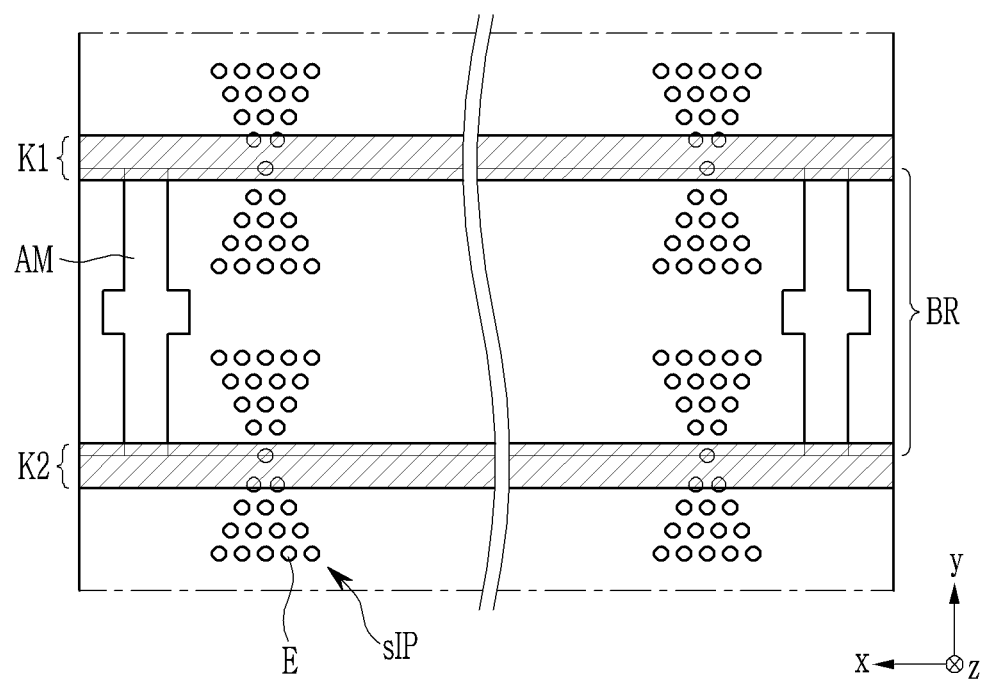
Figure 20:
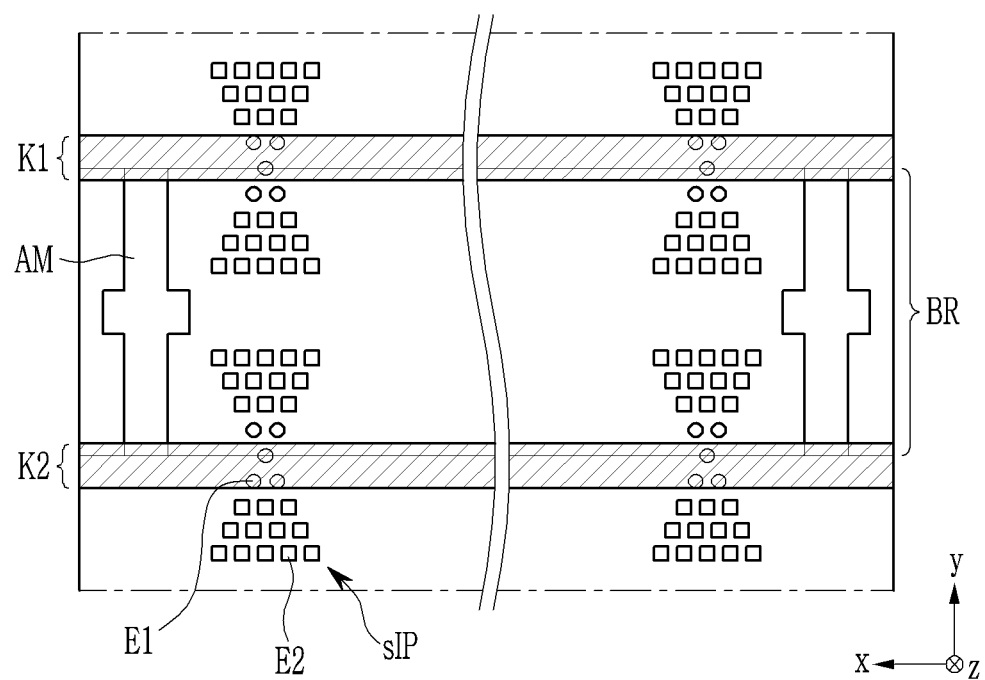

The shape and the arrangement of the electrodes E may be variously changed. For example, referring to FIG. 18, FIG. 19, and FIG. 20, the electrodes E constituting the sub-pattern sIP may be arranged like an hourglass. The electrodes E, as shown in FIG. 19, may be circular, and may have other shapes. The electrodes E may have a combination of several shapes. For example, the electrodes E, as shown in FIG. 20, may have a combination of the circular electrodes E1 and the quadrangular electrodes E2. If the electrodes E1 and E2 of the different shapes of the sub-pattern sIP are regularly included, the number of electrodes E1 and E2 that do not overlap the cuffs K1 and K2 may evaluate the alignment accuracy from the shape. For example, in the lower edge portion of the bending region BR in FIG. 20, only the quadrangular electrodes E2 are disposed below the cuff K2, and the circular electrodes E1 and the quadrangular electrodes E2 are disposed above the cuff K2. Accordingly, it may be immediately possible to grasp that the cuff K2 is positioned slightly below the lower edge of the bending region BR.

The quadrangular and circular electrodes E are illustrated, however if they are arranged regularly as the number gradually increases or decreases up and down farther from the upper and lower edge of the bending region BR and may be identified by the vision inspection etc., the shape thereof is not limited.

While the inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A display device comprising:
a display panel including a display area for displaying an image and a non-display area, the non-display area including a bending region,
wherein the display panel in the bending region includes:
a plurality of connection wires,
a pattern including a plurality of electrodes, and
a protection layer positioned between the plurality of connection wires and the pattern,
wherein each electrode is insulated and is not configured to transmit electric signals, and
wherein the pattern is electrically isolated from the plurality of connection wires.

2. The display device of claim 1, wherein,
the plurality of electrodes are arranged over at least about 50% of the bending region.

3. The display device of claim 2, wherein,
each electrode is quadrangular or circular.

4. The display device of claim 2, wherein,
the display panel further includes a substrate, and
the plurality of connection wires are positioned to cross the bending region on the substrate and configured to transmit signals from outside the display panel.

5. The display device of claim 4, wherein,
the protection layer is positioned on the plurality of connection wires, and the pattern is positioned on the protection layer.

6. The display device of claim 5, wherein,
the display panel further includes a pixel electrode positioned in the display area, and
the pattern is made of a same material as the pixel electrode.

7. The display device of claim 4, wherein,
the protection layer is positioned between the substrate and the plurality of connection wires, and the pattern is positioned between the substrate and the protection layer.

8. The display device of claim 7, wherein,
the display panel further includes a gate electrode positioned in the display area, and
the pattern is made of a same material as the gate electrode.

9. The display device of claim 1, wherein,
the display panel further includes a first alignment mark and a second alignment mark respectively positioned at both sides of the bending region, and
the pattern is positioned between the first alignment mark and the second alignment mark.

10. The display device of claim 1, wherein,
the pattern further includes a plurality of dummy electrodes adjacent to the bending region.

11. A display device comprising:
a display panel including a display area for displaying an image and a non-display area, the non-display area including a bending region; and
a protection film positioned on one surface of the display panel to not overlap the bending region,
wherein the display panel includes a pattern including a plurality of electrodes arranged in the bending region,
wherein each electrode is insulated and is not configured to transmit electric signals,
the protection film includes a first portion and a second portion respectively positioned at both sides of the bending region, and
a portion of the pattern overlaps at least one of the first portion and the second portion, wherein the pattern includes a plurality of sub-patterns, and
each sub-pattern includes a plurality of electrodes of which a number is changed farther from the edge of the bending region, wherein the plurality of electrodes are separated from each other.

12. The display device of claim 11, wherein,
the plurality of electrodes are positioned symmetrically with respect to one edge of the bending region.

13. The display device of claim 12, wherein, each sub-pattern includes a plurality of electrodes of which a number increases farther from the edge of the bending region.

14. The display device of claim 12, wherein, each electrode is quadrangular or circular.

15. The display device of claim 12, wherein, each sub-pattern includes a plurality of electrodes having two or more kinds of shapes.

16. The display device of claim 11, wherein, the display panel further includes a substrate and a plurality of connection wires crossing the bending region on the substrate, and
the pattern is positioned at a same layer as the plurality of connection wires.

17. The display device of claim 16, wherein,
in the bending region, the display panel further includes a first protection layer positioned between the substrate and the plurality of connection wires and a second protection layer positioned on the plurality of connection wires, and
the pattern is positioned between the first protection layer and the second protection layer.

18. The display device of claim 16, wherein,
the display panel further includes a source electrode and a drain electrode positioned in the display area, and
the pattern is made of a same material as the source electrode and the drain electrode.

* * * * *